(12) United States Patent
Cosgrave

(10) Patent No.: US 11,448,528 B2
(45) Date of Patent: Sep. 20, 2022

(54) RESETTABLE CLOSED-LOOP MULTI-TURN MAGNETIC SENSOR

(71) Applicant: Analog Devices International Unlimited Company, Limerick (IE)

(72) Inventor: Gavin Patrick Cosgrave, Enniscorthy (IE)

(73) Assignee: Analog Devices International Unlimited Company, Limerick (IE)

( * ) Notice: Subject to any disclaimer, the term of this patent is extended or adjusted under 35 U.S.C. 154(b) by 88 days.

(21) Appl. No.: 16/890,583

(22) Filed: Jun. 2, 2020

(65) Prior Publication Data

US 2021/0033425 A1 Feb. 4, 2021

Related U.S. Application Data

(60) Provisional application No. 62/882,292, filed on Aug. 2, 2019.

(51) Int. Cl.
*G01D 5/16* (2006.01)
*G01R 33/025* (2006.01)
*G01R 33/09* (2006.01)

(52) U.S. Cl.
CPC .............. *G01D 5/16* (2013.01); *G01R 33/025* (2013.01); *G01R 33/098* (2013.01)

(58) Field of Classification Search
CPC ........ G01D 5/16; G01D 2205/26; G01D 5/14; G01D 5/142; G01R 33/02; G01R 33/025; G01R 33/09; G01R 33/098; G01R 33/12; G01R 33/1292; G01R 33/091; G01R 33/093; G01R 29/20; G01B 7/30
See application file for complete search history.

(56) References Cited

U.S. PATENT DOCUMENTS

| 10,228,267 B2 | 3/2019 | Mattheis et al. |
| 2018/0216965 A1 | 8/2018 | Richard et al. |
| 2018/0356252 A1* | 12/2018 | Diegel ................. G01R 33/098 |
| 2018/0372510 A1 | 12/2018 | Mattheis et al. |
| 2021/0003643 A1* | 1/2021 | Gebhardt ............... G01D 5/145 |

FOREIGN PATENT DOCUMENTS

| DE | 10 2010 022 611 A1 | 12/2011 |
| DE | 10 2017 005 562 A1 | 1/2018 |
| WO | WO-2017097284 A1 * | 6/2017 ......... G01D 5/24476 |

OTHER PUBLICATIONS

Extended European Search Report received in EP 20188164.6 dated Dec. 15, 2020.

(Continued)

*Primary Examiner* — Son T Le
(74) *Attorney, Agent, or Firm* — Knobbe, Martens, Olson & Bear, LLP

(57) ABSTRACT

Aspects of this disclosure relate to a resettable closed-loop multi-turn magnetic sensor. In one aspect, the sensor includes a nanowire forming a plurality of loops, a plurality of domain orientation sensors configured to detect locations of a pair of domain walls within the nanowire, and an initialization circuit configured to inject the pair of domain walls into the nanowire. The nanowire forms a closed-loop via a bridge crossing connecting two of the loops.

18 Claims, 9 Drawing Sheets

(56) References Cited

OTHER PUBLICATIONS

Borie, Benjamin, et al. "Geometrically enhanced closed-loop multiturn sensor devices that enable reliable magnetic domain wall motion." *Applied Physics Letters* 111.24 (2017): 242402.
Borie, Benjamin, et al. "Reliable propagation of magnetic domain wails in cross structures for advanced multiturn sensors." *Physical Review Applied* 8.4 (2017): 044004.
Heinze, Daniel, et al. "Angular dependence of the domain wall depinning field in sensors with segmented corners." *J. Phys. Conf. Ser.* vol. 903. 2017.
Mattheis, R., et al. "Concepts and steps for the realization of a new domain wall based giant magnetoresistance nanowire device: From the available 24 multiturn counter to a 212 turn counter." *Journal of Applied Physics* 111.11 (2012): 113920.
Vyatskikh, Andrey, et al. "Additive manufacturing of 3D nano-architected metals." *Nature communications* 9.1 (2018): 1-8.

\* cited by examiner

RESETTABLE CLOSED-LOOP MULTI-TURN MAGNETIC SENSOR

CROSS-REFERENCE TO RELATED APPLICATION

This application claims the benefit of priority under 35 U.S.C. § 119(e) of U.S. Provisional Patent Application No. 62/882,292, filed Aug. 2, 2019, the disclosure of which is hereby incorporated by reference in its entirety.

FIELD

Embodiments of the described technology relate to electronic systems, and more particularly, to multi-turn magnetic sensors.

BACKGROUND

Multi-turn magnetic sensors can be used to detect the number of revolutions of a multi-turn sensor by measuring an external magnetic field. Certain multi-turn magnetic sensors include an open-loop sensor. Open-loop sensors may be limited in the number of revolutions that can be counted by the number of loops forming the sensor. In particular, open-loop sensors can also use a domain wall generator to inject a domain wall into one end of the sensor, which propagates through the loops of the sensor. Such domain walls can propagate though the sensor without any power being supplied to the sensor.

SUMMARY OF THE DISCLOSURE

The innovations described in the claims each have several aspects, no single one of which is solely responsible for its desirable attributes. Without limiting the scope of the claims, some prominent features of this disclosure will now be briefly described.

One aspect of this disclosure is a multi-turn magnetic sensor, comprising: a nanowire forming a plurality of loops; a plurality of domain orientation sensors configured to detect locations of a pair of domain walls within the nanowire; and an initialization circuit configured to inject the pair of domain walls into the nanowire, wherein the nanowire forms a closed-loop via a bridge crossing connecting two of the loops.

The bridge can allow the pair of domain walls to propagate around the entirety of the nanowire without annihilating the pair of domain walls.

The initialization circuit can comprise a first set of metal traces that cross each loop of the plurality of loops at a first crossing and a second crossing, a first spacing between the metal traces at the first crossing being different that a second spacing between the metal traces at the second crossing.

The initialization circuit can further comprise a second set of metal traces that cross a first loop of the plurality of loops at a third crossing and a sixth crossing and other loops of the plurality of loops at a fourth crossing and a fifth crossing, wherein the second set of metal traces have the first spacing at the fourth and sixth crossings and the second spacing at the third and fifth crossings.

The first spacing can be narrower than the second spacing.

The initialization circuit comprises a plurality of metal traces and the initialization circuit can be configured to: measure an orientation of an external magnetic field, calculate currents for horizontal and vertical legs of the loops, and apply currents to the plurality of metal traces based on the calculated currents.

The initialization circuit can be further configured to: measure a state of the sensor, determine whether the sensor is in a predetermined state, and increase the currents in response the sensor not being in the predetermined state.

The bridge crossing can form the nanowire into a continuous closed-loop without any intersections.

The sensor can further comprise: a plurality of tunnel-magnetoresistance (TMR) sensors configured to measure a state of the sensor.

Each of the loops of the nanowire can comprise a plurality of nanowire stripes running in parallel, wherein each TMR sensor comprises a plurality of pairs of TMR junctions, each of the pairs of TMR junctions formed on a corresponding one of the nanowire stripes.

Another aspect of this disclosure is a method for initializing a closed-loop multi-turn magnetic sensor, comprising: measuring an external magnetic field; determining a magnitude of one or more reset currents based on the measured external magnetic field; and applying the one or more reset currents to inject a pair of domain walls into the closed loop magnetic sensor.

The one or more reset currents comprises a horizontal reset current and a vertical reset current, the method further comprising: calculating the horizontal and vertical reset currents based on the measured orientation, wherein applying the one or more reset currents comprises: applying the horizontal reset current to a first set of metal traces that cross horizontal legs of the magnetic sensor, and applying the vertical reset current to a second set of metal traces that cross vertical legs of the magnetic sensor.

The method can further comprise: measuring a state of the magnetic sensor using a plurality of tunnel-magnetoresistance (TMR) sensors; and determining whether the magnetic sensor is in a desired state based on the measured state.

The method can further comprise: increasing the reset currents in response to determining that the magnetic sensor is not in the desired state.

The desired state can comprise the sensor having a pair of domain walls.

Yet another aspect of this disclosure is a magnetic multi-turn angle sensor system, comprising: a printed circuit board (PCB); a multi-turn (MT) sensor disposed on the PCB; an angle sensor disposed on the PCB; and a processing circuit disposed on the PCB, the processing circuit is configured to receive output signals from the MT sensor and the angle sensor and process the received signals to provide a rotational angle position, wherein the MT sensor comprises: a nanowire forming a plurality of loops, a plurality of domain orientation sensors configured to detect locations of a pair of domain walls within the nanowire, and an initialization circuit configured to inject the pair of domain walls into the nanowire, wherein the nanowire forms a closed-loop via a bridge crossing connecting two of the loops.

The bridge can allow the pair of domain walls to propagate around the entirety of the nanowire without annihilating the pair of domain walls.

The initialization circuit can comprise a first set of metal traces that cross each loop of the plurality of loops at a first crossing and a second crossing, a first spacing between the metal traces at the first crossing being different that a second spacing between the metal traces at the second crossing.

The initialization circuit can further comprise a second set of metal traces that cross a first loop of the plurality of loops at a third crossing and a sixth crossing and other loops of the plurality of loops at a fourth crossing and a fifth crossing, wherein the second set of metal traces have the first spacing at the fourth and sixth crossings and the second spacing at the third and fifth crossings.

The first spacing can be narrower than the second spacing.

DETAILED DESCRIPTION OF EMBODIMENTS

Figure 1:
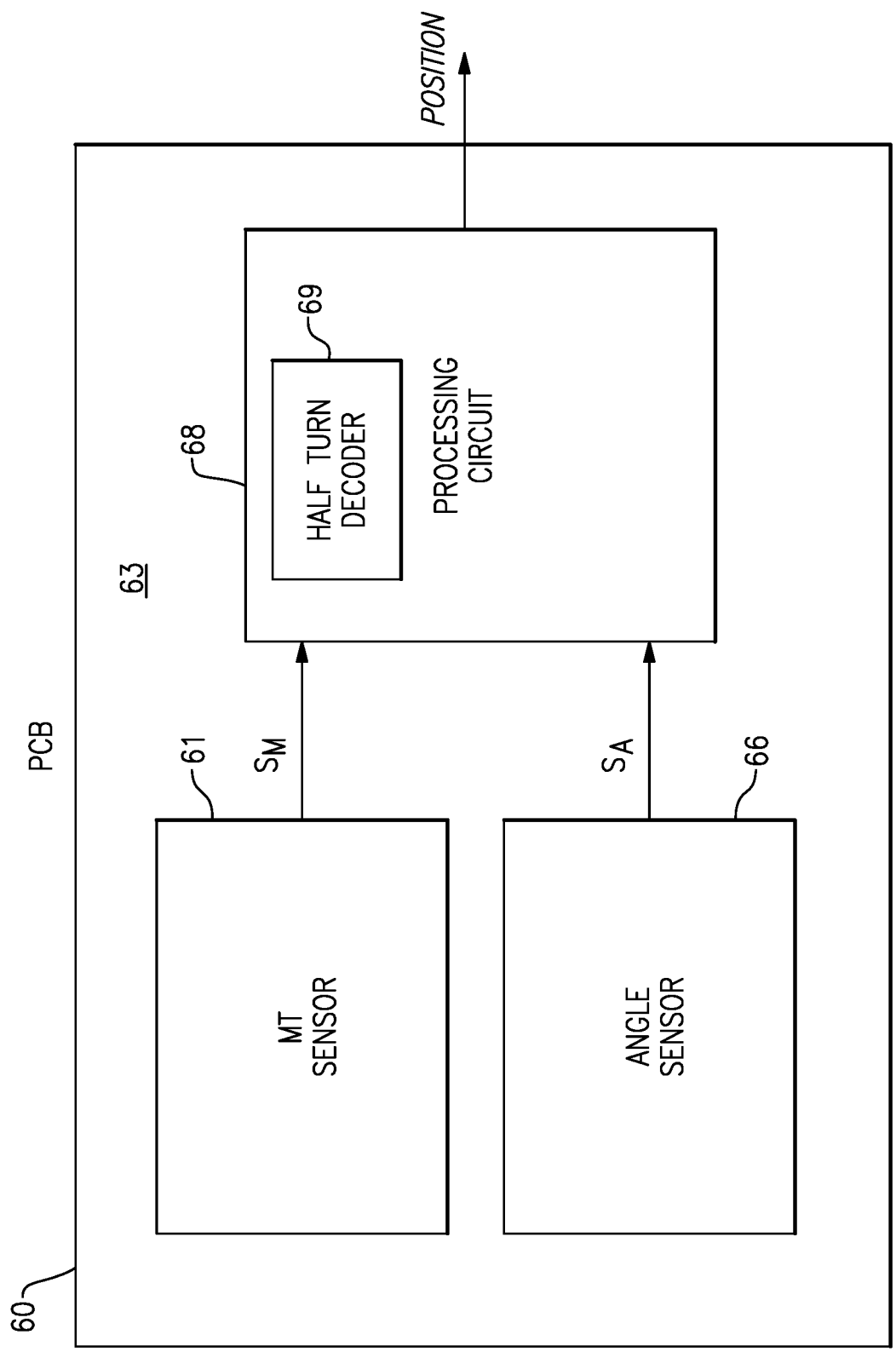
FIG. 1 is a schematic block diagram of a magnetic sensor system that includes a multi-turn sensor and an angle sensor according to an embodiment.

The following detailed description of embodiments presents various descriptions of specific embodiments of the invention. However, the invention can be embodied in a multitude of different ways. In this description, reference is made to the drawings where like reference numerals may indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Magnetic sensors can be used to monitor the angular position and rotational velocity of a moving shaft. Such magnetic sensing can be applied to a variety of different applications, such as automotive applications, medical applications, and industrial control applications, among others. Several technologies exist for making magnetic sensors. For instance, there are Hall-effect sensors. Hall-effect sensors can generate direct current (DC) output voltages based on the strength of an applied magnetic field. A rotating magnetic field creates sinusoidal waveforms in Hall-effect sensors which can then be processed by a computer to calculate angle. There are also giant magnetoresistance (GMR) sensors. In a GMR sensor, GMR resistors are formed using layers of ferromagnetic and non-magnetic materials. The GMR resistors can be used in Wheatstone bridges to sense variations in rotating magnetic fields. In addition, there are tunnel-magnetoresistance (TMR) sensors. TMR sensors may have a higher output than anisotropic magnetoresistive (AMR) sensors and GMR sensors. In general, TMR sensors may include a barrier layer interposed between two ferromagnetic layers. For example, as discussed below, a TMR sensor may include a TMR pinned layer, a TMR barrier layer, and free layer (e.g., a NiFe nanowire).

Magnetic sensors can be integrated on a chip for sensing and recording the number of turns in half-turn increments, in which states can change every quarter turn, or for sensing the angle of a rotating magnetic field. A magnetic sensor for sensing and recording the number of turns in quarter-turn increments can be referred to as a multi-turn (MT) sensor. A magnetic sensor for sensing the rotational angle over a range of 360 degrees can be referred to as an angle sensor or as a single turn (360 degrees) angle sensor. Both a multi-turn sensor and an angle sensor can be used together to determine the rotational angle position that exceeds 360 degrees. This combination of a multi-turn sensor with an angle sensor can also be referred to as a multi-turn angle sensor.

Additional circuitry can be used to process and/or convert signals from the multi-turn sensor and the angle sensor into useful information. For instance, an analog-to-digital converter (ADC) can be used to convert voltages from the sensors into digital data that can be processed into the overall rotational angle position and/or angular velocity. The accuracy of these conversions can depend upon many factors including sensor placement, environmental factors such as temperature, and magnetic field strength, to name a few. In a multi-turn angle sensor, there can also be relative error between information from its angle sensor and information from its multi-turn sensor.

Multi-turn sensors can include magnetoresistive sensing elements. For instance, a multi-turn sensor can be a TMR sensor. A multi-turn sensor can include any suitable angle sensor, such as a Hall effect sensor, an AMR sensor, a GMR sensor, other magnetoresistive sensing elements, or the like.

Position information generated based on an angle sensor can represent an angle associated with a magnetic field. For instance, the position information can represent rotations of a magnetic field. The magnetic field can be generated by a magnetic target, which can include one or more magnets. Such a magnetic target can be part of or attached to any suitable object, such as a shaft, gear, linear or rotary actuator, a modular clutch actuator (MCA), steering wheel, etc. The position information can represent an angle or rotation, which can correspond to more than more 360 degree rotation. Accordingly, the position information can represent an overall angle of rotation an object that includes or is attached to the magnetic target.

In some instances, the position information can represent a number of half-turns or full turns. In such instances, the angle sensor can be a quadrant detector, such as an AMR quadrant detector, and the phase shift correction can be determined from the quadrant detector and a signal associated with the multi-turn sensor in accordance with the principles and advantages discussed herein. Then the position information can be determined based on an output of the multi-turn sensor and the phase shift correction.

FIG. 1 is a schematic block diagram of a magnetic multi-turn angle sensor system 60 that includes a multi-turn (MT) sensor 61 and an angle sensor 66 according to an embodiment. The multi-turn angle sensor system 60 can also include a processing circuit 68 and a printed circuit board (PCB) 63 on which the MT sensor 61, the angle sensor 66, and the processing circuit 68 are disposed. All of the PCB 63, the MT sensor 61, the angle sensor 66, and the processing circuit 68 can be integrated together. The processing circuit 68 can receive signal(s) $S_M$ from the MT sensor 61 and signal(s) $S_A$ from the angle sensor 66 and then process these received signals to provide a rotational angle position Position. The processing circuit 68 can include a half-turn decoder 69. The half-turn decoder 69 can receive signal(s) $S_M$ from the MT sensor 61 and output a half-turn count. The half-turn count can be used to determine a phase shift correction, for example, as will be discussed in more detail below. The signal(s) $S_M$ from the MT sensor 61 and the signal(s) $S_A$ from the angle sensor 66 can be analog signals. For instance, the signal(s) $S_M$ from the MT sensor 61 can be voltage signals derived from resistor networks, such as Wheatstone bridges including TMR or GMR resistors.

Closed-Loop Multi-Turn Magnetic Sensors

Multi-turn magnetic sensors can be used to detect the number of revolutions of the multi-turn sensor by measuring an external magnetic field. One embodiment of a multi-turn magnetic sensor includes an open-loop sensor. Open-loop sensors may be limited in the number of revolutions that can be counted by the number of loops forming the sensor. In particular, open-loop sensors may also use a domain wall generator to inject a domain wall into one end of the sensor. Such domain walls can propagate though the sensor without any power being supplied to the sensor. However, when the domain wall reaches the end of the sensor, the domain wall may be annihilated, such that further rotations of the open-loop sensor cannot be measured.

Figure 2A:
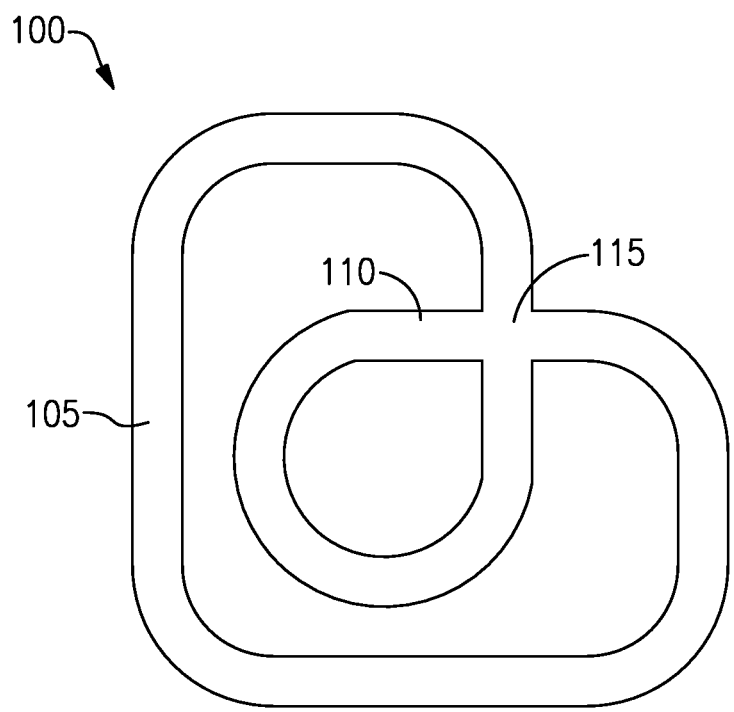
FIG. 2A illustrates an example closed-loop multi-turn magnetic sensor.
Figure 2B:
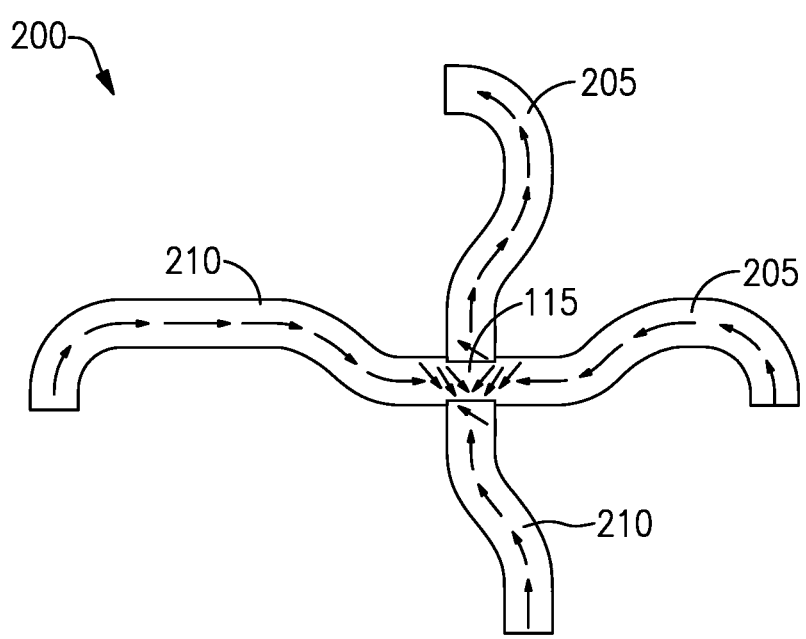
FIG. 2B illustrates a close up view of an intersection formed in the closed-loop multi-turn magnetic sensor of FIG. 2A.

Multi-turn magnetic sensors can also be implemented to form a closed-loop sensor. FIG. 2A illustrates an example closed-loop multi-turn magnetic sensor and FIG. 2B illustrates a close up view of an intersection formed in the closed-loop multi-turn magnetic sensor of FIG. 2A. With reference to FIG. 2A, the closed-loop sensor 100 includes a first loop 105 and a second loop 110 which cross each other at an intersection or crossing 115. The intersection 115 may be formed to function as a "syphon" intersection 115 such that domain walls propagate across the intersection 115 in the desired direction, rather than travelling down the incorrect leg of the sensor.

With reference to FIG. 2B, the illustrated close up view 200 includes the intersection 115 between two legs 205 of the first loop 105 and two legs 210 of the second loop 110. Also shown in FIG. 2B are arrows in each of the legs 205 and 210 which illustrate the direction of the magnetic field. A domain wall may be defined as the how domain walls can propagate through the intersection 115 due to the effect of the syphon. One reason for using a syphon is that manufacturing technologies cannot easily create a bridge type crossing that allows domain walls to propagate without being annihilated. For example, two layers of a semiconductor device may be connected using vias, however, the sharp angles formed by vias may not allow domain walls to propagate therethrough. Thus, certain closed-loop multi-turn magnetic sensors use one or more intersection 115 including domain wall syphons. However, the use of a true bridge crossing that allows the passage of domain walls would address the annihilation and/or nucleation issues arising due to the syphon intersection 115. Due to the sensitivity of domain-wall propagation to differences in materials, defects and edges, manufacturing the bridge as a layer change in a typical semiconductor process (e.g., using vias and/or using photo-masking) may not be feasible.

Closed-Loop Multi-Turn Magnetic Sensors Including a Bridge

Aspects of this disclosure relate to a closed-loop multi-turn magnetic field sensor including a bridge-type crossing. In certain embodiments, the sensor can function as a magnetically writable, electronically readable memory, that can track the number of rotations of an external magnetic field without requiring power. Aspects of this disclosure relate to the use of a process for manufacturing involving Additive Manufacturing to create a bridge crossing, a reset scheme, and a read-out circuit using TMR junctions, and the closed-loop multi-turn sensor itself.

There is a need for a sensor which can counts rotations of an external magnetic field without requiring power while sensing turns of the sensor. As described above, certain multi-turn sensors may be based on GMR technology and/or use an intersection-type crossing that syphons domain walls as domain walls cross the intersection. Aspects of this disclosure can overcomes difficulties with intersection-based sensors. In particular, aspects of this disclosure relate to a closed-loop multi-turn sensor which is manufactured using an additive manufacturing process to construct a bridge to close the sensor loop, rather than using a syphon crossover. Such a bridge may have improved magnetic domain-wall propagation characteristics when compared to a syphon embodiment, resulting in improved sensor reliability. Further aspects of this disclosure relate to a reset scheme that can be used to initialize the sensor using current carrying conductors on the sensor. The reset scheme can allow the sensor to be reset, which improves the sensor's robustness to stray magnetic fields during manufacture. Additional aspects relate to a TMR readout circuit which can be used to read the current state of the multi-turn sensor. In some implementations, GMR-based sensors may not be compatible with additive manufacturing processes, and thus, a TMR circuit may be used to read the state of the sensor.

Additive manufacturing (AM) processes can form otherwise impossible shapes, as additive manufacturing can be used to form structures using lasers to deposit atomic layers, without the use of photo-masks. Using additive manufacturing, it is possible to form a continuous loop where the crossing is a bridge rather than an intersection.

Many additive manufacturing processes at the nano-scale can operate with polymers. Certain additive manufacturing processes involving metals may be limited to a resolution of about 20-50 μm resolution. In an exemplary closed-loop multi-turn sensor, the wire width may be approximately 350 nm wide, and thus, typical additive manufacturing processes are not precise enough to manufacture such a closed-loop sensor. However, recent developments in additive manufacturing techniques have resulted in processes capable of manufacturing metal structures with about 100 nm resolution. Such techniques may be suitable for depositing nanowire structures for use a closed-loop sensor as described herein.

In general, a multi-turn sensor can be broken down, at a high level, into 3 critical elements. These elements include: a domain wall generator, a nanowire used for domain wall propagation, and a domain orientation sensor.

In certain exemplary multi-turn sensors, domain wall propagation can be achieved within a NiFe free layer of a GMR sensor. However, the NiFe free layer does not need to be part of a GMR stack. The NiFe free layer may be part of the GMR stack such that a GMR sensor can be used as a domain orientation sensor. By separating the domain orientation sensor and the nanowire in which the domain walls propagate, any 360° MR sensor can be used as a domain orientation sensor.

Figure 3:
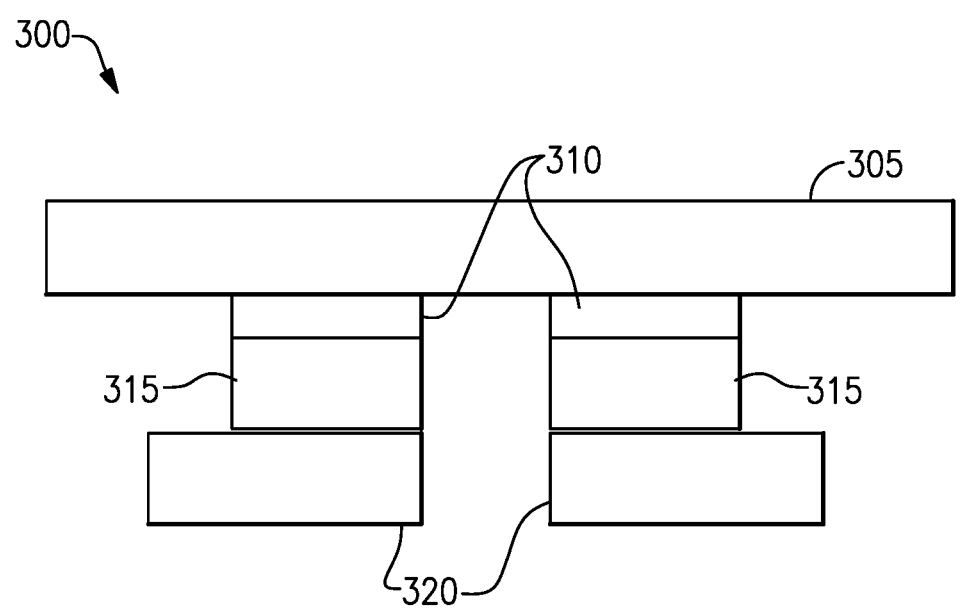
FIG. 3 is a cross-sectional view of an example domain orientation sensor which can be used to read the state of the multi-turn sensor.

FIG. 3 is a cross-sectional view of an example domain orientation sensor which can be used to read the state of the multi-turn sensor. The domain orientation sensor may be implemented as a TMR sensor 300 that includes a nanowire 305 that crosses the TMR sensor 300 at various points. The TMR sensor 300 also includes a TMR barrier layer 310, a TMR pinned layer 315, and two electrodes 320. The TMR junction free layer is formed by a portion of the NiFe nanowire 305 that crosses other layers 310 to 320 of the TMR sensor 300. A TMR tunnelling current can flow in a short section of the nanowire 305, forming an electrical connection between the two TMR junctions. By configuring the TMR sensor 300 to allow a tunnelling current to form between the two junctions, there is no need for a direct electrical connection to the NiFe nanowire 305, which can reduce manufacturing complexity and limit problem(s) associated with tap-points blocking domain-wall movement along the NiFe nanowire 305.

Figure 4:
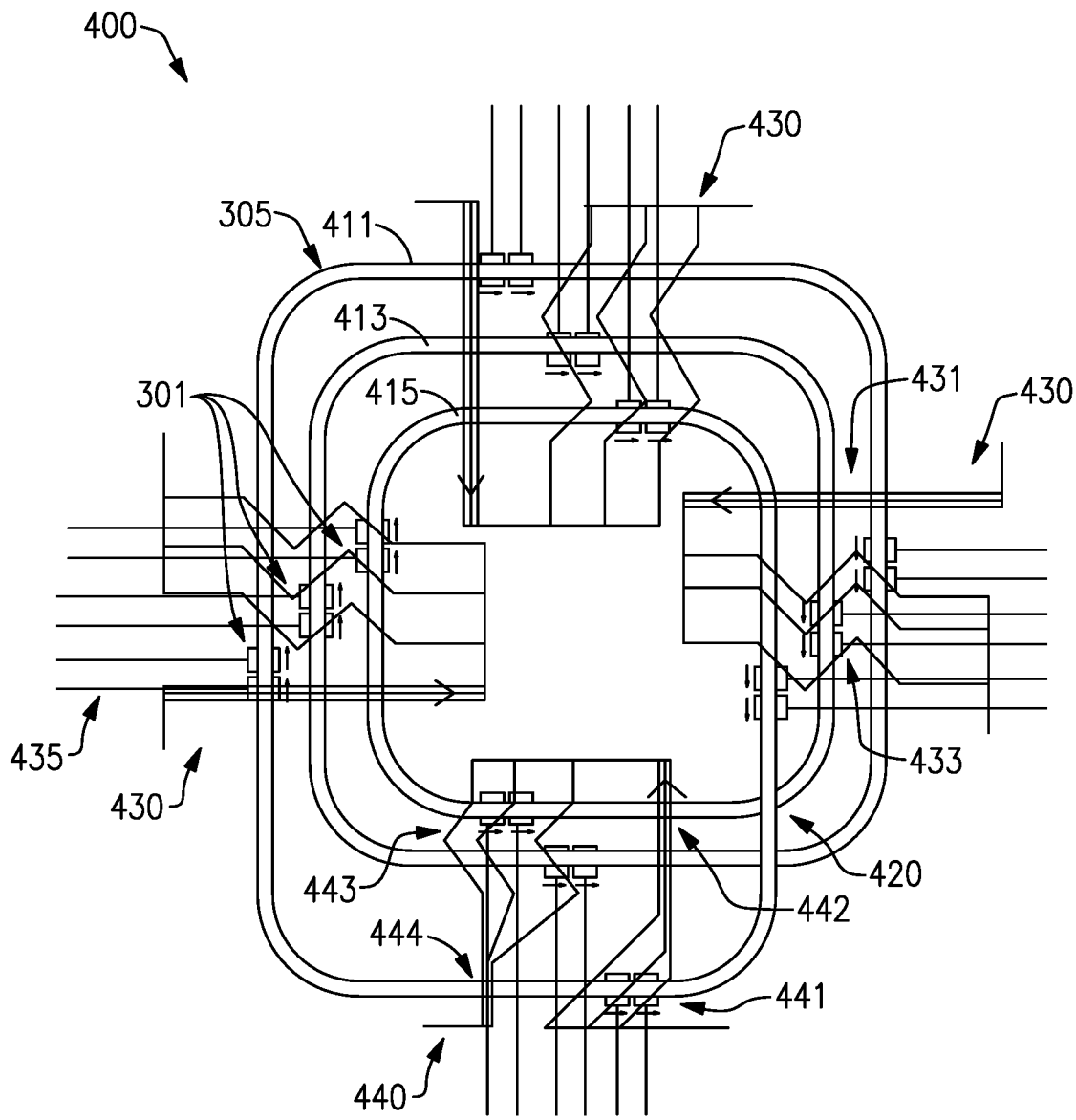
FIG. 4 is an example embodiment of a closed-loop multi-turn magnetic sensor in accordance with aspects of this disclosure.

FIG. 4 is an example embodiment of a closed-loop multi-turn magnetic sensor 400 in accordance with aspects of this disclosure. As shown in FIG. 4, the sensor 400 includes a NiFe nanowire 305 in a closed loop configuration. Specifically, the NiFe nanowire 305 includes three separate loops 411, 413, and 415 with a bridge 420 connecting the first loop 411 to the third loop 415 without the NiFe nanowire 305 forming an intersection. Each leg of each of the loops 411, 413, and 415 can include a TMR sensor 301 connected to wires 435 which can read out the state of the multi-turn sensor 400 by, for example, detecting the location(s) of domain wall(s) along the loops 411, 413, and 415.

The sensor 400 further includes a first set of metal traces 430 and a second set of metal traces 440 which can be used to initialize the state of the sensor 400. The first and second sets of metal traces 430 and 440 may form an initialization circuit along with a reset circuit (described below). The particular spacing between the metal traces 430 and 440 as they traverse the legs of the loops 411, 413, and 415 can be used to specify the number of domain walls injected into the sensor 400 when current is passed through the metal traces 430 and 440. In the embodiment of FIG. 4, each of the first metal traces 430 has a similar configuration in which the spacing between the first metal traces 430 is narrower at a first crossing 431 with the loops 411, 413, and 415 than at a second crossing 433 with the loops 411, 413, and 415. Specifically, when traversing the loops 411, 413, and 415 in a clockwise direction, each of the first metal traces 430 first cross the loops 411, 413, and 415 with a first spacing at the first crossing 431 and then return from a center of the loops 411, 413, and 415 with a second spacing at the second crossing 433, where the first spacing is narrower than the second spacing. As illustrated by arrows in FIG. 4, an external reset circuit (not illustrated) can apply a current to each of the first metal traces 430 which flows into the first crossing 431 and back through the second crossing 433.

The second metal traces 440 may be similar to the first metal traces except for the spacing of the second metal traces 440 as they cross one leg of the loops 411, 413, and 415. In the embodiment of FIG. 4, the second metal traces 440 cross the first loop 411 at a third crossing 441 with a second spacing and the second and third loops 413 and 415 at a fourth crossing 442 with a first spacing. The second metal traces 440 further cross the second and third loops 413 and 415 at a fifth crossing 443 with a second spacing and the first loop 411 at a sixth crossing 444 with a first spacing. The first spacing is narrower than the second spacing.

Due to the spacing of the metal traces 430 and 440 as they cross the loops 411, 413, and 415, the sensor 400 can be initialized by injecting one pair of domain walls into the sensor 400 when a current is applied to the metal traces 430 and 440. After initialization, the pair of domain walls can track the external magnetic field (e.g., the domain walls will traverse the loops 411, 413, and 415 as the sensor 400 is rotated with respect to the external magnetic field).

To remove domain walls within the sensor 400, the current in each of the metal traces 430 and 440 should either flow towards the center of the NiFe nanowire 305 spiral or away from the center of the NiFe nanowire 305 spiral. In this case, when applying the right-hand-rule, all loops 411, 413, and 415 of the NiFe nanowire 305 spiral will have their magnetic domains pointing in the same direction. By reversing the direction of the imposed magnetic field over one leg of the spiral (e.g., the leg of the first loop 411 crossing the second set of metal traces 440), a single domain wall pair will be injected into the NiFe nanowire 305.

Since currents flow in a loop, the return currents can pass over/under the NiFe nanowire 305 spiral legs without exceeding the nucleation field strength, to avoid annihilating the desired domain walls. This can be achieved by spacing the conductors for the return currents such that their fields do not add to greater than the nucleation field strength.

In the sensor layout illustrated in FIG. 4, the current in the metal traces 430 and 440 forms a magnetic field. The field strength of the magnetic field can be high enough to introduce domain wall nucleation at the point where the traces have a narrower spacing (e.g., the first crossings 431, the fourth crossing 442, and the sixth crossing 444), but not high enough to introduce nucleation where the traces have a wider spacing (e.g., the second crossings 433, the third crossing 441, and the fifth crossing 443). By selecting the appropriate spacing and current levels, the field at one point on each leg of the sensor 400 can exceed the nucleation field strength, without exceeding the nucleation field strength where the currents return past the spiral legs. That is, the combination of the current applied to the metal traces 430 and 440 and the widths of the spacing of the metal traces 430 and 440 at each of the first through sixth crossings 431, 433, and 441-444 can be selected to either exceed the nucleation field strength (for the narrower spacings) or be less than the nucleation field strength.

On the leg of the first loop 411 crossing the second set of metal traces 440, the spacing of the fields can be adjusted so that the return current induces a field above the nucleation field strength, whereas the in-bound current does not. This induces a magnetic domain pointing in the opposite direction to all other legs in the spiral, thus inducing a single domain-wall pair into the spiral.

Figure 5:
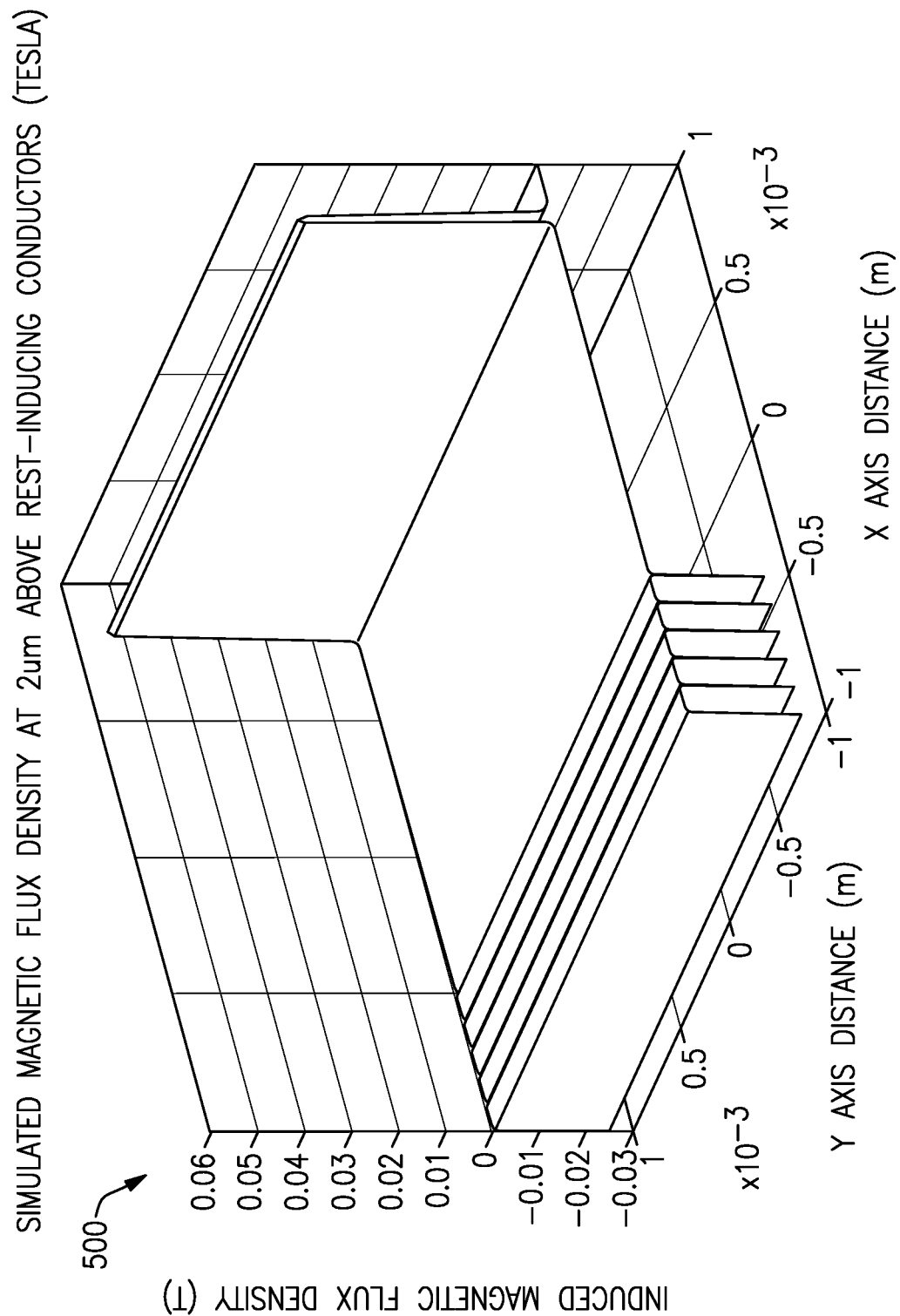
FIG. 5 illustrates a simulation of the magnetic flux induced by the closely-spaced and widely-spaced conductors for the sensor of FIG. 4.

FIG. 5 illustrates a simulation of the magnetic flux induced by the closely-spaced and widely-spaced conductors for the sensor 400 of FIG. 4. Specifically, FIG. 5 illustrates the simulated induced magnetic flux density (T) with respect to the Y axis distance (m) and the X axis distance (m). Specifically, the magnetic flux density may be simulated at a point 2 μm above the metal traces 430 and 440.

The strength of the external magnetic field of the environment in which the multi-turn sensor 400 is located can affect the current needed to exceed the nucleation field strength in any particular direction. For example, if the external field is close to the nucleation field strength, in order to change the orientation of the domain in one of the legs of the NiFe nanowire 305 to the same direction as the external field, only a relatively small current is required to change the orientation of the domain walls. However, in order to re-orient the domain walls in the NiFe nanowire 305 spiral leg to a direction opposite to the external field, a relatively larger current (e.g., close to two times the normal nucleation field inducing current) will be required.

To ensure that only the currents crossing the NiFe nanowire 305 at the narrower spacings of the metal traces 430 and 440 cause nucleation events, and that the currents crossing the NiFe nanowire 305 at the wider spacings of the metal traces 430 and 440 do not cause nucleation events, aspects of this disclosure can actively monitor the state of the domain walls in the sensor 400. Based on the monitoring of the domain walls, the sensor 400 can control the currents applied to the metal traces 430 and 440 such that the induced fields exceed the nucleation field strength, but are not high enough to produce undesired nucleation events. Different currents can be applied to each of the different metal traces 430 illustrated in FIG. 4, and a different current can be applied to the metal traces 440 in order to properly inject a pair of domain walls into the sensor 400.

Figure 6:
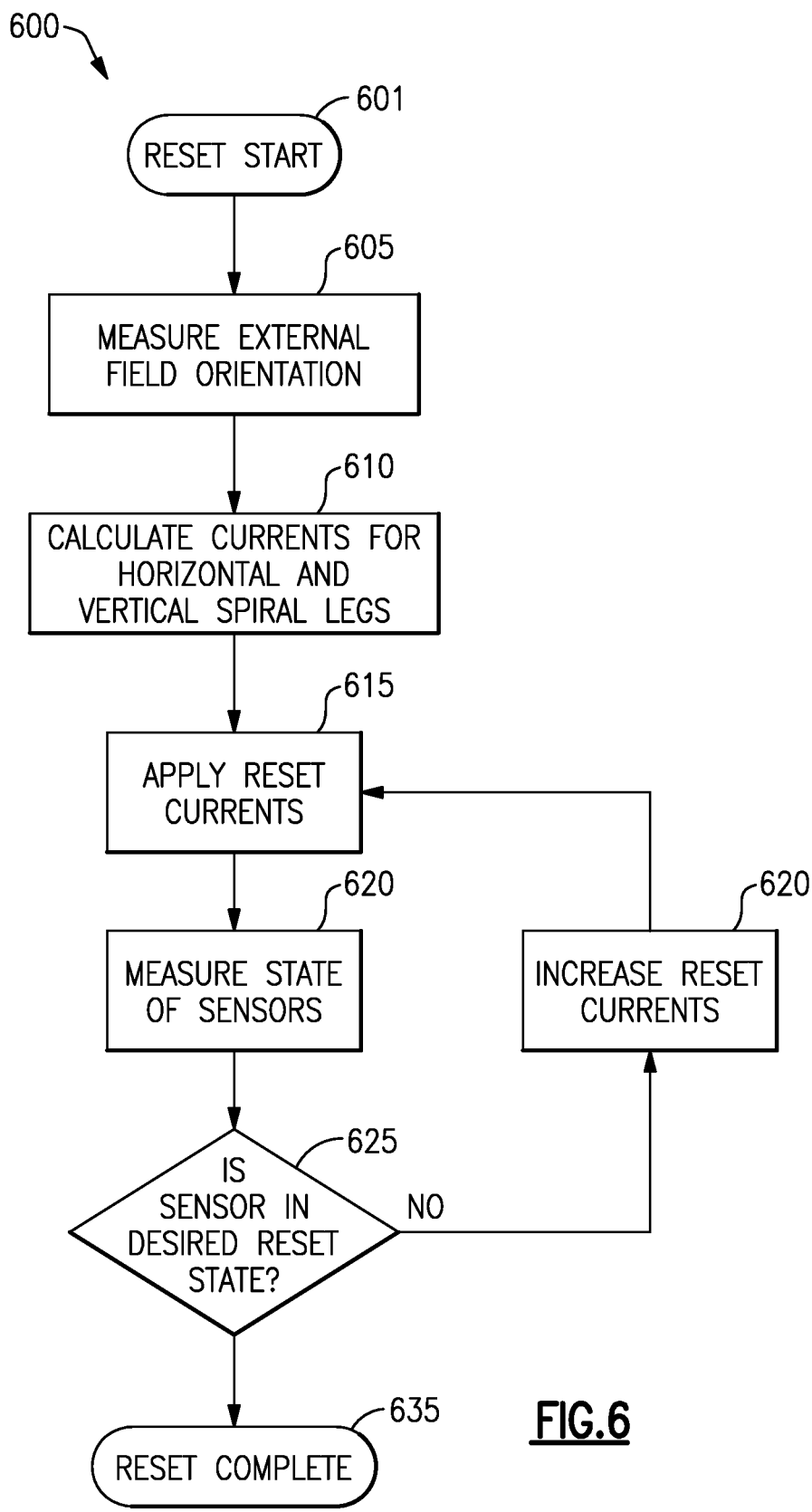
FIG. 6 is flow-chart illustrating a method for resetting domain walls in the sensor that can inject the desired number of domain walls into the sensor.

FIG. 6 is flow-chart illustrating a method 600 for resetting domain walls in the sensor 400 that can inject the desired number of domain walls into the sensor 400. The method 600 may be performed by a reset circuit (not illustrated) external to the sensor 400. The reset circuit may be configured to measure state of the sensor 400 (e.g., via the TMR sensors 301) and apply currents to the metal traces 430 and 440. The reset circuit may further include a magnetic field sensor configured to measure an external field orientation or reset circuit may receive a signal indicative of the external field orientation from a magnetic field sensor external to the reset circuit.

The method 600 begins at block 601. In some embodiments, the reset circuit may begin the method 600 in response to receding a command to reset or initialize the sensor 400. At block 605, the reset circuit measures the orientation of the external magnetic field. This may include directly measuring the external magnetic field orientation or receiving a signal that is indicative of the external magnetic field orientation. At block 610, the reset circuit calculates currents for the horizontal and vertical legs of the NiFe nanowire 305 based on the orientation of the external magnetic field. That is, due to the difference in relative orientation between each of the horizontal and vertical legs of the NiFe nanowire 305 and the external magnetic field, the current required to cause nucleation events for each of the horizontal and vertical magnetic fields can be different. The method can also involve calculating currents for each leg of the NiFe nanowire 305 individually.

At block 615, the reset circuit applies reset currents to the metal traces 430 and 440. The magnitude of the reset currents may be the currents calculated at block 610. At block 620, the reset circuit measures the state of the sensor 400. In some embodiments, the reset circuit may measure the location of domain walls in the multi-turn sensor 400 using the TMR sensors 301. At block 625, the reset circuit determines whether the sensor 400 is in the desired reset state. For example, the reset circuit may determine whether the applied currents injected a pair of domain walls into the NiFe nanowire 305. If the sensor 400 is in the desired state, the method 600 ends at block 635. However, if the sensor 400 is not in the desired state (e.g., a greater or fewer number of domain walls are present in the sensor 400), at block 630, the reset sensor increases the reset currents. The reset sensor may then return to block 615 and apply the increased reset currents to the metal traces 430 and 440.

Figure 7:
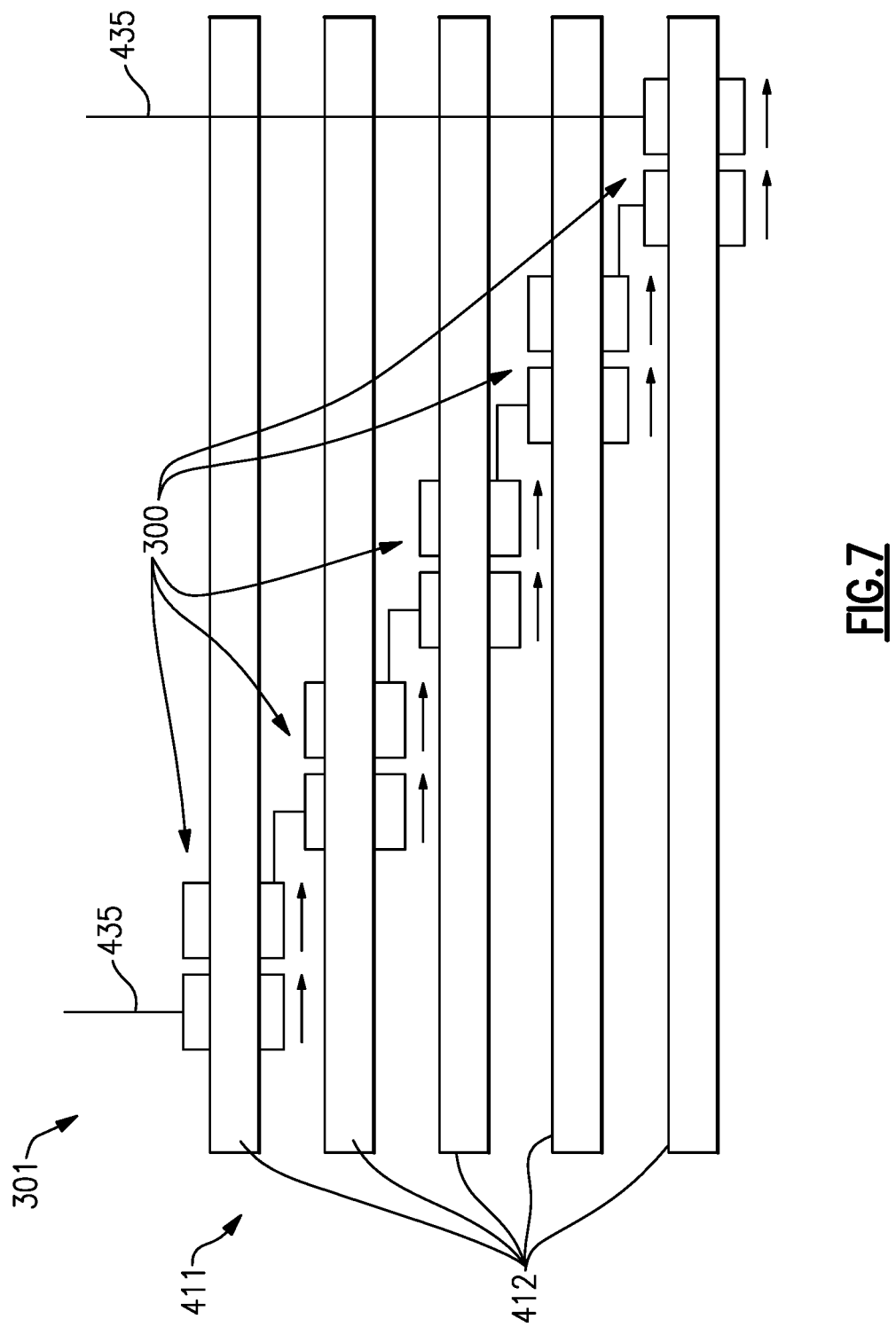
FIG. 7 is an example embodiment of a TMR sensor.

FIG. 7 is an example embodiment of a TMR sensor 301. The TMR sensor 301 may include a plurality of pairs of TMR junctions 300 (such as in the TMR sensor 300 of FIG. 3) connected in series. The tunneling oxide layer (e.g., the TMR barrier layer 310 of FIG. 3) may be formed as a thin layer (e.g., about 1 nm) that increases the risk of electrostatic discharge (ESD). In the example TMR sensor shown in FIG. 7, the first loop 411 is illustrated as including a plurality of racetrack stripes 412 arranged in parallel, however, a similar configuration may be formed for each TMR sensor 301 illustrated in FIG. 4. That is, as shown in FIG. 7, the nanowire 301 may include five separate nanowire racetrack stripes 412 arranged in parallel. Although five stripes 412 are illustrated in FIG. 7, a greater or fewer number of nanowire stripes 412 can be included.

Figure 8:
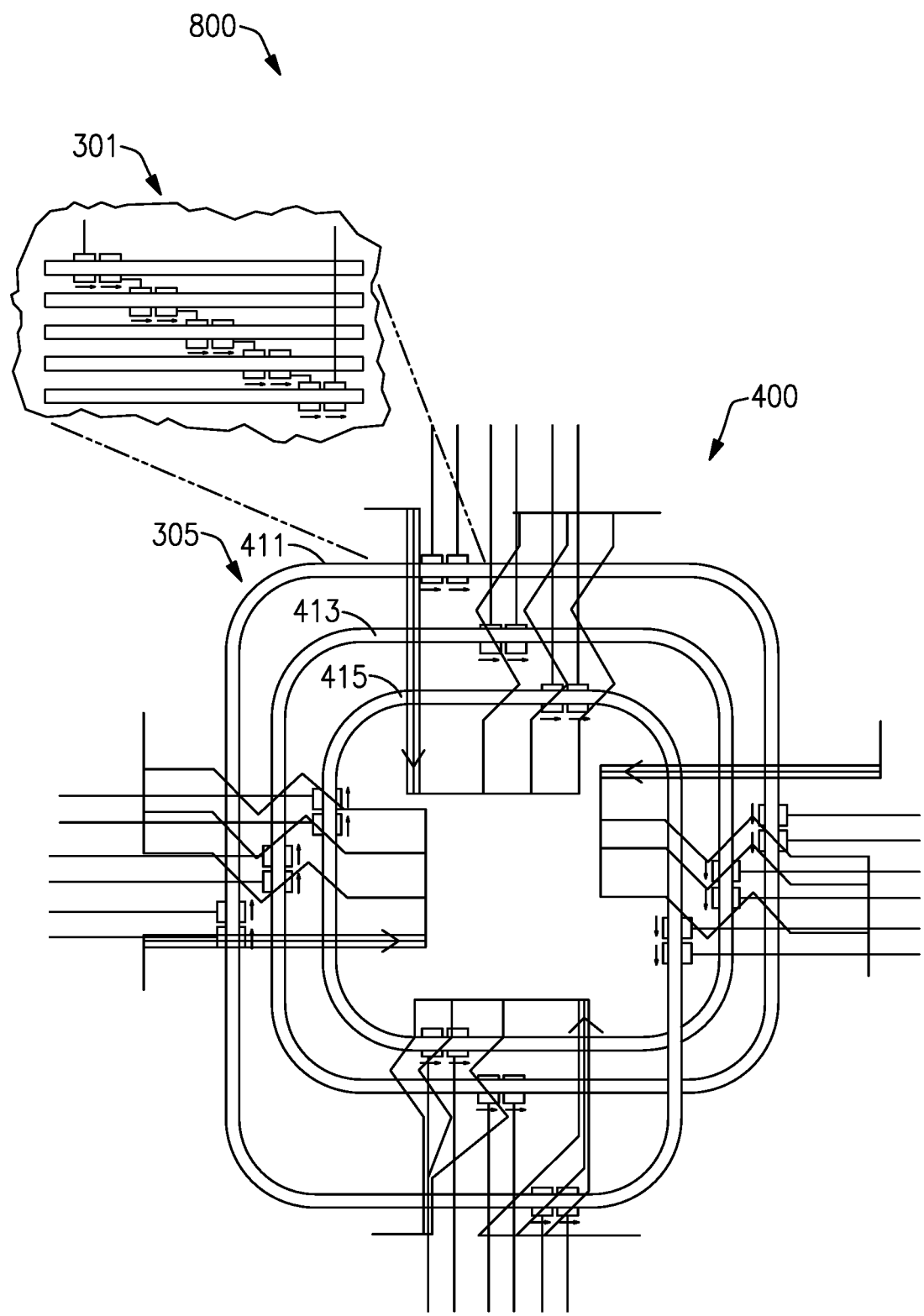
FIG. 8 illustrates the overall closed-loop multi-turn sensor and how each TMR sensor can be included on each leg of the NiFe nanowire.

FIG. 8 illustrates the overall closed-loop multi-turn sensor 400 and how each TMR sensor 301 can be included on each leg of the NiFe nanowire 305. Specifically, with reference to FIGS. 7 and 8, a pair of TMR junctions 300 may be formed on each stipe 412, with wires 435 connecting the pairs of TMR junctions 300 in parallel to form the TMR sensor 301. Thus, in some embodiments, each loop 411, 413, and 415 may include a plurality of NiFe nanowire tracks 412 running in parallel, with a TMR sensor 301 as illustrated in FIG. 7 for each leg of each of the loops 411, 413, and 415.

The loops 411, 413, and 415 in the sensor layout of FIGS. 7 and 8 form a resistive connection between each of the TMR junctions 300. This connection may makes it more difficult to read out multiple TMR sensors 301 in parallel. Thus, in some embodiments, a readout circuit may read each set of TMR junctions 300 sequentially and comparing the read out voltage to a reference voltage.

Figure 9:
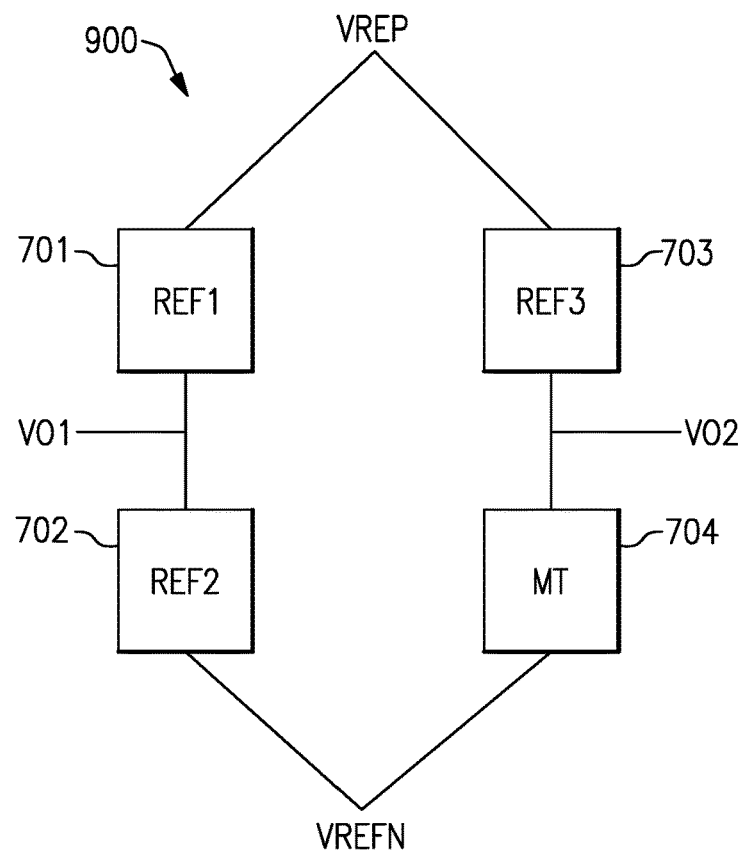
FIG. 9 illustrates a readout circuit which can be used to read each set of TMR junctions sequentially.
Figure 10:
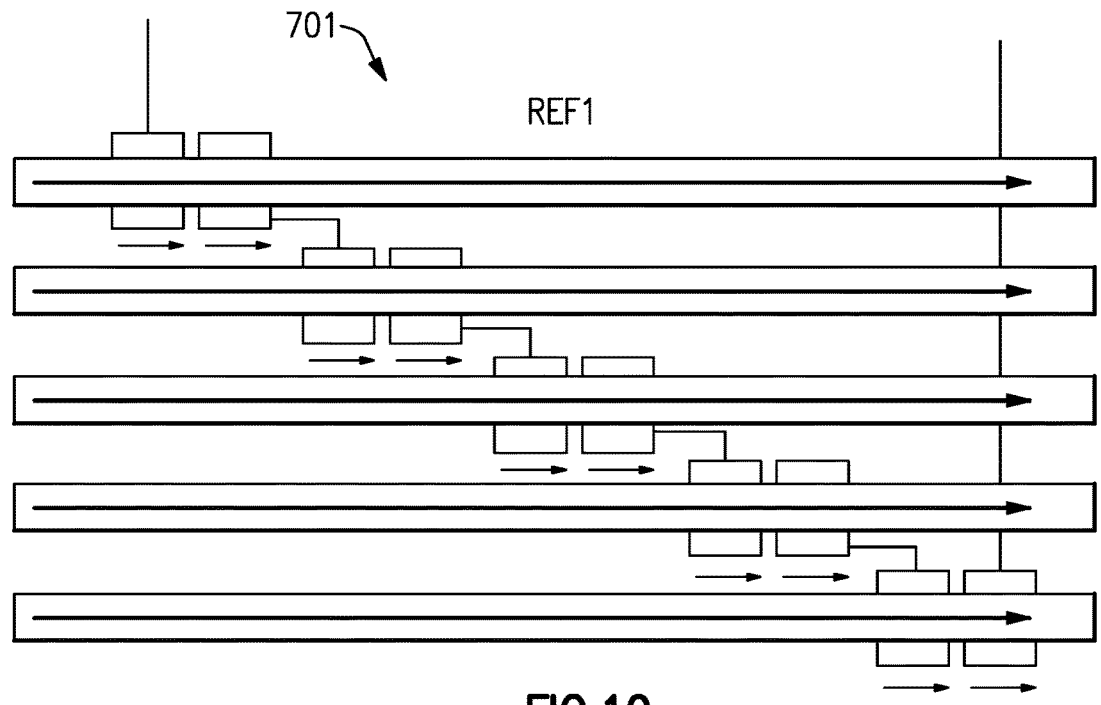
FIG. 10 is an example implementation of a TMR sensor.

FIG. 9 illustrates a readout circuit 900 which can be used to read each set of TMR junctions sequentially. The readout circuit 900 includes a plurality of TMR sensors REF1 701, REF2 702, and REF3 703. FIG. 10 is an example implementation of a TMR sensor 701. In particular, each of the TMR sensors 701-703 may be implemented as shown in FIG. 10. The readout circuit 900 is configured to initialize one of the TMR sensors 701 so the magnetic domains in the nanowires 305 point in approximately the same direction (as indicated by the arrows in FIG. 10). The sensor 400 is operated in a magnetic window such that the junction domain orientation does not change (i.e. below the nucleation field strength).

Applications

Any of the principles and advantages discussed herein can be applied to other systems, not just to the systems described above. Some embodiments can include a subset of features and/or advantages set forth herein. The elements and operations of the various embodiments described above can be combined to provide further embodiments. The acts of the methods discussed herein can be performed in any order as appropriate. Moreover, the acts of the methods discussed herein can be performed serially or in parallel, as appropriate. While circuits are illustrated in particular arrangements, other equivalent arrangements are possible.

Any of the principles and advantages discussed herein can be implemented in connection with any other systems, apparatus, or methods that benefit could from any of the teachings herein. For instance, any of the principles and advantages discussed herein can be implemented in connection with any devices with a need for correcting rotational angle position data derived from rotating magnetic fields. Additionally, the devices can include any magnetoresistance or Hall effect devices capable of sensing magnetic fields.

Aspects of this disclosure can be implemented in various electronic devices or systems. For instance, phase correction methods and sensors implemented in accordance with any of the principles and advantages discussed herein can be included in various electronic devices and/or in various applications. Examples of the electronic devices and applications can include, but are not limited to, servos, robotics, aircraft, submarines, toothbrushes, biomedical sensing devices, and parts of the consumer electronic products such as semiconductor die and/or packaged modules, electronic test equipment, etc. The consumer electronic products can include, but are not limited to, a phone such as a smart phone, a laptop computer, a tablet computer, a wearable computing device such as a smart watch or an ear piece, an automobile, a camcorder, a camera, a digital camera, a portable memory chip, a washer, a dryer, a washer/dryer, a copier, a facsimile machine, a scanner, a multifunctional peripheral device, etc. Further, the electronic devices can include unfinished products, including those for industrial, automotive, and/or medical applications.

Unless the context clearly requires otherwise, throughout the description and the claims, the words "comprise," "comprising," "include," "including," and the like are to be construed in an inclusive sense, as opposed to an exclusive or exhaustive sense; that is to say, in the sense of "including, but not limited to." The words "coupled" or "connected", as generally used herein, refer to two or more elements that may be either directly connected, or connected by way of one or more intermediate elements. Thus, although the various schematics shown in the figures depict example arrangements of elements and components, additional intervening elements, devices, features, or components may be present in an actual embodiment (assuming that the functionality of the depicted circuits is not adversely affected). The words "based on" as used herein are generally intended to encompass being "based solely on" and being "based at least partly on." Additionally, the words "herein," "above," "below," and words of similar import, when used in this application, shall refer to this application as a whole and not to any particular portions of this application. Where the context permits, words in the Detailed Description of Certain Embodiments using the singular or plural number may also include the plural or singular number, respectively. The words "or" in reference to a list of two or more items, is intended to cover all of the following interpretations of the word: any of the items in the list, all of the items in the list, and any combination of the items in the list. All numerical values or distances provided herein are intended to include similar values within a measurement error.

While certain embodiments have been described, these embodiments have been presented by way of example only, and are not intended to limit the scope of the disclosure. Indeed, the novel apparatus, systems, and methods described herein may be embodied in a variety of other forms. Furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure."

What is claimed is:

1. A multi-turn magnetic sensor, comprising:
a nanowire forming a plurality of loops;
a plurality of domain orientation sensors configured to detect locations of a pair of domain walls within the nanowire; and
an initialization circuit configured to inject the pair of domain walls into the nanowire,
wherein the nanowire forms a closed-loop via a bridge crossing connecting two of the loops, the bridge crossing forming the nanowire into a continuous closed-loop without any intersections, and
wherein the initialization circuit comprises a first set of metal traces that cross each loop of the plurality of loops at a first crossing and a second crossing, a first spacing between the metal traces at the first crossing being different that a second spacing between the metal traces at the second crossing.

2. The sensor of claim 1 wherein the bridge allows the pair of domain walls to propagate around the entirety of the nanowire without annihilating the pair of domain walls.

3. The sensor of claim 1 wherein the initialization circuit further comprises a second set of metal traces that cross a first loop of the plurality of loops at a third crossing and a sixth crossing and other loops of the plurality of loops at a fourth crossing and a fifth crossing, wherein the second set of metal traces have the first spacing at the fourth and sixth crossings and the second spacing at the third and fifth crossings.

4. The sensor of claim 1 wherein the first spacing is narrower than the second spacing.

5. The sensor of claim 1 wherein the initialization circuit comprises a plurality of metal traces and wherein the initialization circuit is configured to:
measure an orientation of an external magnetic field,
calculate currents for horizontal and vertical legs of the loops, and
apply currents to the plurality of metal traces based on the calculated currents.

6. The sensor of claim 5 wherein the initialization circuit is further configured to:
measure a state of the sensor,
determine whether the sensor is in a predetermined state, and
increase the currents in response the sensor not being in the predetermined state.

7. The sensor of claim 1 further comprising:
a plurality of tunnel-magnetoresistance (TMR) sensors configured to measure a state of the sensor.

8. The sensor of claim 7 wherein each of the loops of the nanowire comprises a plurality of nanowire stripes running in parallel, wherein each TMR sensor comprises a plurality of pairs of TMR junctions, each of the pairs of TMR junctions formed on a corresponding one of the nanowire stripes.

9. The sensor of claim 1 wherein the bridge crossing is formed using additive manufacturing to eliminate defects and/or edges that would result in annihilation of the pair of domain walls.

10. A method for initializing a closed-loop multi-turn magnetic sensor, comprising:
measuring an external magnetic field;
determining a magnitude of one or more reset currents based on the measured external magnetic field; and
applying the one or more reset currents to inject a pair of domain walls into the closed loop magnetic sensor.

11. The method of claim 10 wherein the one or more reset currents comprises a horizontal reset current and a vertical reset current, the method further comprising:
calculating the horizontal and vertical reset currents based on the measured orientation,
wherein applying the one or more reset currents comprises:
applying the horizontal reset current to a first set of metal traces that cross horizontal legs of the magnetic sensor, and
applying the vertical reset current to a second set of metal traces that cross vertical legs of the magnetic sensor.

12. The method of claim 10 further comprising:
measuring a state of the magnetic sensor using a plurality of tunnel-magnetoresistance (TMR) sensors; and
determining whether the magnetic sensor is in a desired state based on the measured state.

13. The method of claim 12 further comprising:
increasing the reset currents in response to determining that the magnetic sensor is not in the desired state.

14. The method of claim 13 wherein the desired state comprises the sensor having a pair of domain walls.

15. A magnetic multi-turn angle sensor system, comprising:
a printed circuit board (PCB);
a multi-turn (MT) sensor disposed on the PCB;
an angle sensor disposed on the PCB; and
a processing circuit disposed on the PCB, the processing circuit is configured to receive output signals from the MT sensor and the angle sensor and process the received signals to provide a rotational angle position, wherein the MT sensor comprises:
a nanowire forming a plurality of loops,
a plurality of domain orientation sensors configured to detect locations of a pair of domain walls within the nanowire, and
an initialization circuit configured to inject the pair of domain walls into the nanowire, the initialization circuit comprising a first set of metal traces that cross each loop of the plurality of loops at a first crossing and a second crossing, a first spacing between the metal traces at the first crossing being different that a second spacing between the metal traces at the second crossing,
wherein the nanowire forms a closed-loop via a bridge crossing connecting two of the loops.

16. The system of claim 15 wherein the bridge allows the pair of domain walls to propagate around the entirety of the nanowire without annihilating the pair of domain walls.

17. The system of claim 15 wherein the initialization circuit further comprises a second set of metal traces that cross a first loop of the plurality of loops at a third crossing and a sixth crossing and other loops of the plurality of loops at a fourth crossing and a fifth crossing, wherein the second set of metal traces have the first spacing at the fourth and sixth crossings and the second spacing at the third and fifth crossings.

18. The system of claim 15 wherein the first spacing is narrower than the second spacing.

* * * * *